United States Patent [19]

Yoshida

[11] Patent Number: 5,606,282
[45] Date of Patent: Feb. 25, 1997

[54] TRANSIMPEDANCE AMPLIFIER

[75] Inventor: Yuji Yoshida, Kawasaki, Japan

[73] Assignee: Fujitsu Limited, Kawasaki, Japan

[21] Appl. No.: 630,994

[22] Filed: Apr. 12, 1996

Related U.S. Application Data

[63] Continuation of Ser. No. 355,199, Dec. 8, 1994, abandoned.

[30] Foreign Application Priority Data

Jan. 19, 1994 [JP] Japan ................................. 6-004187

[51] Int. Cl.⁶ ........................................ H03F 3/08
[52] U.S. Cl. .................... 330/51; 250/214 A; 330/110; 330/308; 360/114
[58] Field of Search ......................... 330/51, 59, 110, 330/308; 250/214 A; 360/114; 365/44.36

[56] References Cited

U.S. PATENT DOCUMENTS

| | | | |
|---|---|---|---|
| 3,968,361 | 7/1976 | Bumgardner | 250/234 |
| 4,218,613 | 8/1980 | Bletz | 250/214 |
| 5,007,038 | 4/1991 | Nakane et al. | 369/44.36 X |
| 5,030,925 | 7/1991 | Taylor | 250/214 A |

FOREIGN PATENT DOCUMENTS

556000A1  8/1993  European Pat. Off. .

OTHER PUBLICATIONS

IEEE Transactions on Consumer Electronics, vol. CE–32, No. 3, Aug. 1986, New US, pp. 651–657, Y. Fukushima et al 'Integrated Circuits for Tape Recorder Operated by Single Dry Battery', p. 656; figure 10.

Elektronik, vol. 40, No. 15, Jul. 1991 Munchen DE, pp. 59–62, XP 000243104 W. S. Ludolf 'Digitale Ubertragung Mit Lichtwellenleitern 3. Teil: Optische Empfanger'; p. 60; figures 12–15.

Translation of pp. 59 and 60 of the reference Elektronik 40 (1991), 23 Jul., No. 15, Munich, Germany.

European Search Report dated Nov. 27, 1995.

*Primary Examiner*—James B. Mullins
*Attorney, Agent, or Firm*—Armstrong, Westerman, Hattori, McLeland & Naughton

[57] ABSTRACT

A transimpedance amplifier has an amplifier unit, a feedback resistor arranged between the output and input ends of the amplifier unit, a voltage clamp unit connected to the opposite ends of the feedback resistor, to clamp a voltage applied to the ends of the feedback resistor and prevent the amplifier unit from saturating, a current absorption unit arranged on the input side of the amplifier unit, to absorb any large input current supplied to the amplifier unit, and a switching selection unit to activate or deactivate the current absorption unit according to an external control signal. The current absorption unit is activated through the switching selection unit when a large input current is produced to write data to a magneto-optic disk in a magneto-optic disk unit in which the transimpedance amplifier is installed.

14 Claims, 10 Drawing Sheets

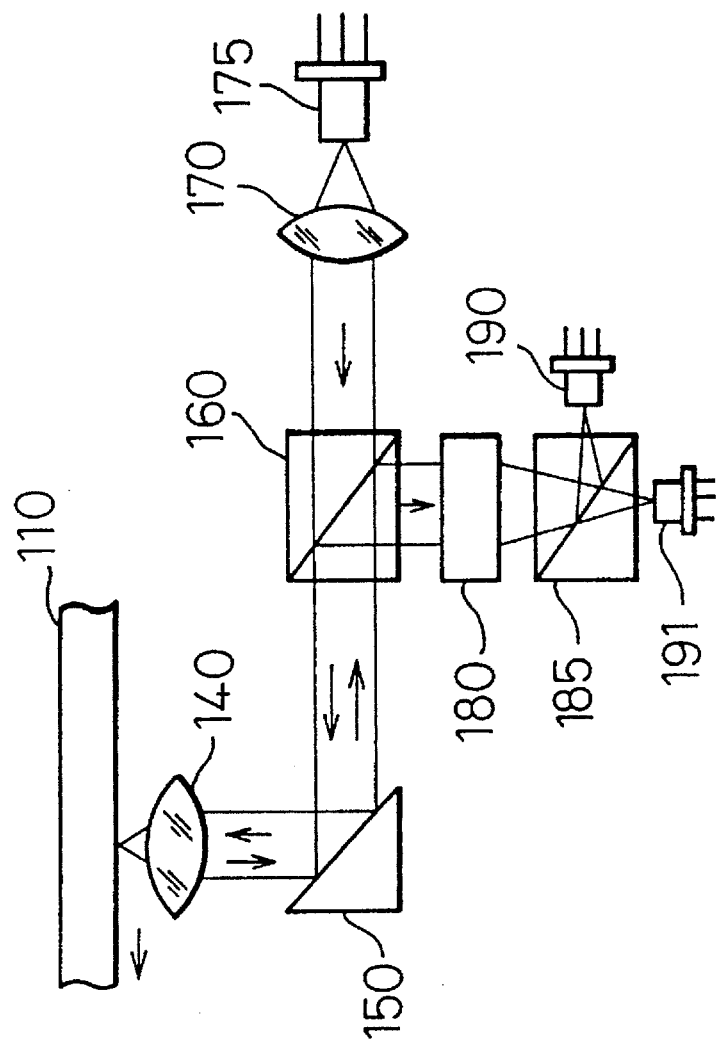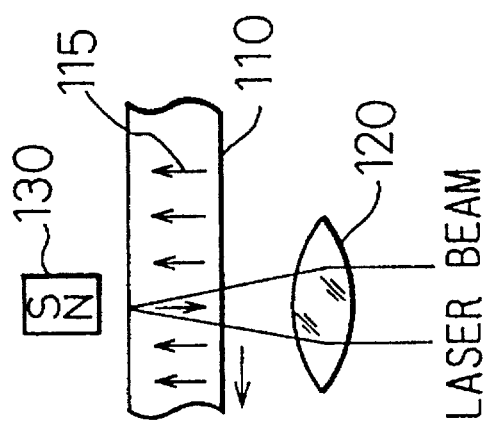

$Ib \geq Ia$

TRANSIMPEDANCE AMPLIFIER

This application is a continuation of application Ser. No. 08/355,199, filed Dec. 8, 1994, now abandoned.

BACKGROUND OF THE INVENTION

1. Field of the Invention

The present invention relates to a transimpedance amplifier employing an amplifier unit that amplifies and converts a relatively weak input current into an output voltage of predetermined level (i.e., an output voltage of proportional level) without being saturated with a strong input current.

The transimpedance amplifier is installed in, for example, a magneto-optic disk unit that uses a magneto-optic disk. The disk unit has a photodiode that produces a very weak current in response to reflected light from the disk, and the transimpedance amplifier converts the weak current into an output voltage of required level, which is used to read the data out of the disk.

2. Description of the Related Art

The recording density of magneto-optic disks is being increased from single density to double density and even to quadruple density. The high-density disks involve more data per revolution and produce write and read signals with narrow intervals and at high frequencies. Increasing the density of a disk is synonymous with increasing the revolution speed (i.e., rotational speed) thereof. To handle such high-density disks, the magneto-optic disk units must employ a transimpedance amplifier capable of processing signals at high speed.

When reading data out of a magneto-optic disk, or when verifying data recorded on the disk, the disk units produce a very weak current. The transimpedance amplifier must have an amplifier unit to amplify such a weak current into an output voltage of required level. The high-density disks involve high-frequency write and read signals, and the high-frequency signals usually contain large noise. Due to the large noise, it is difficult for the amplifier unit to achieve a sufficient C/N ratio on the high-density disks.

When writing data to a magneto-optic disk, or when erasing data from the disk, the disk units produce a very strong current compared with the read or verify operation. In this case, the amplifier unit in the transimpedance amplifier is not required.

The amplifier unit, however, is continuously operated, and therefore, is saturated by the strong current produced during the write or erase operation. Once the amplifier unit is saturated, it takes given time until the amplifier unit is restored to its original function. The saturation of the amplifier unit will cause no problem if the disk is a low density type which involves a slow signal processing speed and allows the amplifier unit to return to its original performance before the next read operation starts. If the disk is of high density, however, it requires a high processing speed, and therefore, the restoration period, from saturation, becomes unnegligible.

FIGS. 1A and 1B show a standard magneto-optic disk unit employing a transimpedance amplifier.

The disk unit achieves read, write, erase, and verify operations. FIG. 1A shows the write operation to write data to a magneto-optic disk 110, and FIG. 1B shows the read operation to read data out of the disk 110.

Referring to FIG. 1A, the disk 110 is made from ferromagnetic material and has a lot of bit regions. The magnetization direction 115 of each bit region determines the data (data value of "1" or "0") in the region. The ferromagnetic material loses its magnetism when the temperature thereof is increased to its Curie temperature. When the material cools down, an electromagnet 130 applies an external magnetic field to a target region of the material, to magnetize the region according to the direction of the magnetic field.

To write data into a region on the disk 110, an objective lens 120 focuses a laser beam to the region, to increase the temperature of the region, and the electromagnet 130 sets the direction of magnetization of the region as required. Through these processes, data are written to the disk 110.

To read data out of the disk 110, a magneto-optic effect, i.e., a magneto-optic Kerr effect is used as shown in FIG. 1B. The magneto-optic Kerr effect is an effect that the polarization angle of a light beam reflected from a ferromagnetic surface changes depending on the direction of magnetization of the surface.

Referring to FIG. 1B, a semiconductor laser 175 emits a weak laser beam, which passes through two lenses 170 and 140 and hits a data recording region on the disk 110. The beam reflected from the disk 110 is again reflected by a mirror 150 and a beam splitter 160, passes through a half-wave plate 180 and a polarization beam splitter 185, and hits two photodiodes 190 and 191. These photodiodes 190 and 191 convert the light into current signals which are sent to amplifier units of respective transimpedance amplifiers (not shown). These amplifier units provide a differential voltage signal (an MO signal) according to a difference between the two current signals. The MO signal corresponds to the polarization angle of the light beam, i.e., the direction of magnetization of the region in question on the disk 110, to provide data recorded in the region.

During the write or erase operation shown in FIG. 1A, the photodiodes shown in FIG. 1B receive strong reflected beams from the disk 110 and generate very large currents of, for example, 10 to 100 microamperes compared with small currents of, for example, 100 nanoamperes to several microamperes produced during the read operation shown in FIG. 1B.

When the amplifier units in the transimpedance amplifiers receive such large input currents, the amplifier units are saturated to lose their amplification functions. If the saturated state continues until a read or verify operation starts after the write operation, data will not be read correctly. Namely, if the amplifier units are saturated, it is impossible to start the read or verify operation.

Magneto-optic disk units that handle single-density magneto-optic disks involve a slow data transfer rate, and this causes no problem even if the saturated amplifier units take given time to be restored to its original functions. Even if the saturation causes a trouble in the disk units, it may be solved by adjusting the intensity of the laser beam or by adjusting the dimensions of optical parts, such as mirrors and beam splitters, in the disk units.

These measures, however, are not applicable to magneto-optic disk units that handle double-density or quadruple-density disks because they must process the signals quickly to realize high-speed write and read operations. For these disk units, a long restoration period after saturation causes a serious problem.

As explained above, a large current to an input terminal of a transimpedance amplifier saturates the amplifier unit in the transimpedance amplifier and this temporarily stops the operation of the amplifier.

Amplifier units that are deeply saturated by a large current and take a long time to be restored to its normal functions are not suitable for magneto-optic disk units that handle high-density disks.

SUMMARY OF THE INVENTION

An object of the present invention is to provide a transimpedance amplifier to be installed in, for example, a magneto-optic disk unit. The transimpedance amplifier employs an amplifier unit for amplifying and converting a small input current into an output voltage of required level which allows data to be read. Even when a large input current is supplied to the amplifier unit, the amplifier unit is unsaturated and capable of speedily processing signals.

In order to accomplish the object, the present invention provides a transimpedance amplifier having an amplifier unit and a feedback resistor disposed between the output and input ends (terminals) of the amplifier unit, to amplify and convert an input current into an output voltage of predetermined level. The converter further has a voltage clamp means connected between the opposite ends of the feedback resistor, to clamp a voltage applied to the ends of the feedback resistor (i.e., a voltage applied across the feedback resistor) and prevent the amplifier unit from saturating; a current absorption means arranged on the input side of the amplifier unit, for absorbing a large input current to the amplifier unit; and a switching selection means for activating or deactivating the current absorption means according to an external control signal.

The transimpedance amplifier is installed in, for example, a magneto-optic disk unit which uses a magneto-optic disk. If a large input current is produced during a write operation of the disk, the switching selection means activates the current absorption means.

Another aspect of the present invention provides a transimpedance amplifier having an amplifier unit and a feedback resistor connected to the output and input ends of the amplifier unit, to amplify and convert an input current into an output voltage of required level. The converter further has a diode element connected to the opposite ends of the feedback resistor, to clamp a voltage applied to the ends of the feedback resistor and prevent the amplifier unit from saturating; a first transistor element connected to the input of the amplifier unit, to absorb any large input current supplied to the amplifier unit; a second transistor element cooperating with the first transistor element, to form a current mirror circuit; a constant current source for supplying a predetermined constant current to the second transistor element; and a change-over switch arranged between the constant current source and the second transistor element, to connect and disconnect the constant current source to and from the second transistor element. The voltage clamping diode element has a function of preventing the first transistor element in the current absorption means from saturating.

The change-over switch is turned ON to supply the constant current to the second transistor element so that the first transistor element of the current mirror circuit entirely absorbs any large input current. The switch is turned OFF to deactivate the first and second transistor elements.

The transimpedance amplifier is installed in, for example, a magneto-optic disk unit which uses a magneto-optic disk. When writing data to the disk, the switch is turned ON, and when reading data out of the disk, the switch is turned OFF.

The current supplied from the constant current source to the second transistor element with the switch being ON is equal to or greater than a large input current to be absorbed by the first transistor element.

The diode element may be a pn-junction diode, or a bipolar transistor whose base and collector are short-circuited to each other, or a MOS transistor whose gate and drain are short-circuited to each other.

The first and second transistor elements may be bipolar transistors, or MOS transistors.

The transimpedance amplifier may consist of any proper combination of the diode element and the first and second transistor elements.

The voltage clamp means, which may be a diode element, is connected to the output and input ends of the amplifier unit and prevents an input voltage to an input transistor of the amplifier unit from dropping to a level that deactivates the input transistor.

In this way, the amplifier unit in the transimpedance amplifier according to the present invention is applicable to, for example, a magneto-optic disk unit and is not saturated even if a large current is supplied to the amplifier unit. The present invention, therefore, allows the disk unit to quickly start a read operation after a write operation and speedily process write and read signals on high-density magneto-optic disks.

BRIEF DESCRIPTION OF THE DRAWINGS

The above object and features of the present invention will be more apparent from the following description of the preferred embodiments with reference to the accompanying drawings, wherein:

FIG. 1A explains a write operation of a magneto-optic disk unit;

FIG. 1B explains a read operation of the magneto-optic disk unit;

DESCRIPTION OF THE PREFERRED EMBODIMENTS

The embodiments of the present invention will be explained with reference to FIGS. 2 to 11.

Figure 2:
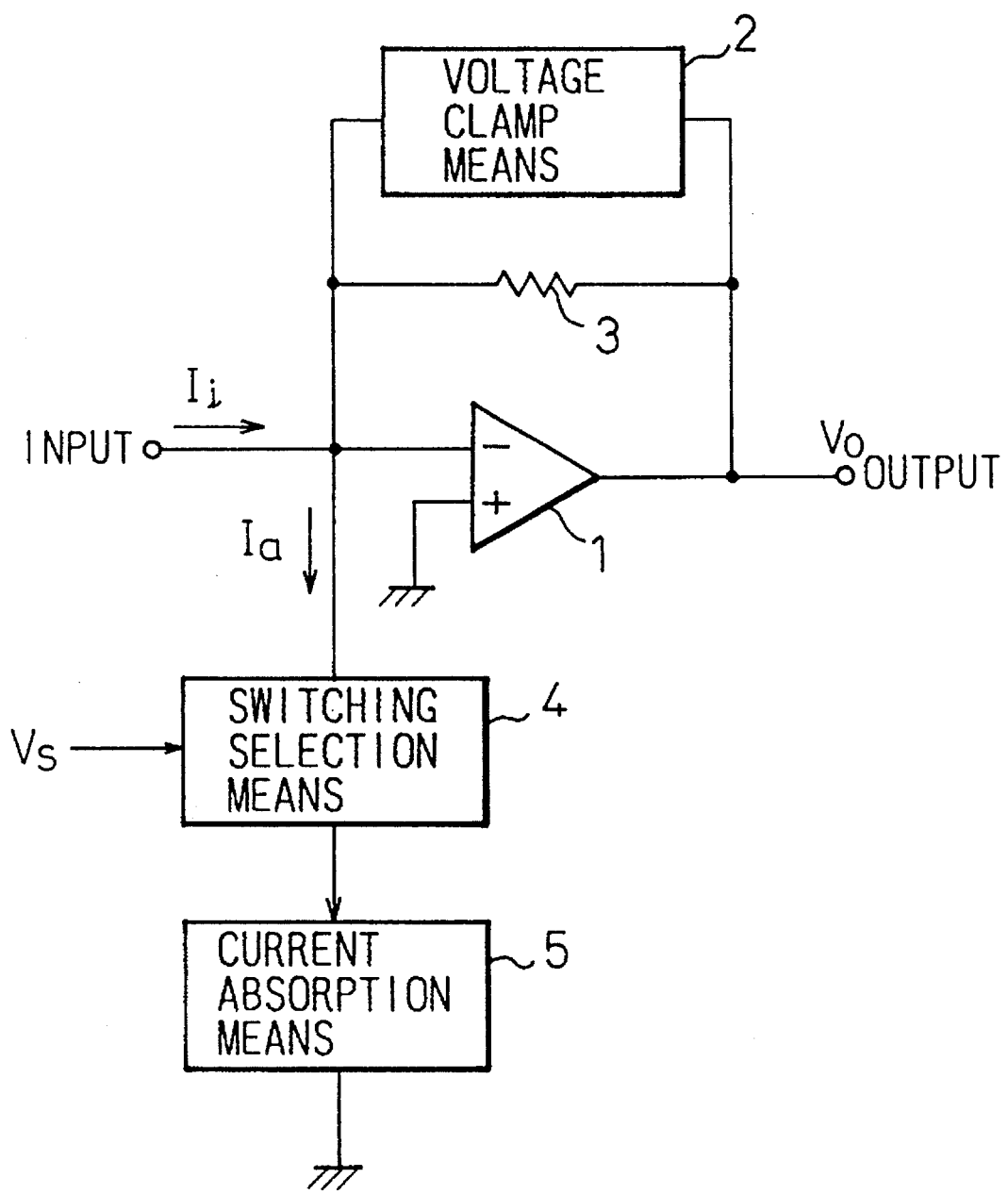
FIG. 2 is a block diagram showing an essential embodiment based on the principle of the present invention.

FIG. 2 is a block diagram showing an essential embodiment based on the principle of a transimpedance amplifier according to the present invention, as installed in, for example, a magneto-optic disk unit.

The transimpedance amplifier has an amplifier unit 1 and a feedback resistor 3 disposed between the output and input ends of the amplifier unit 1, to partly feed an output voltage of the amplifier unit 1 back to the input of the amplifier unit 1. The amplifier unit 1 and feedback resistor 3 amplify and convert a small input current Ii into an output voltage Vo of required level according to the specifications of the transimpedance amplifier.

The transimpedance amplifier also has a voltage clamp means 2 connected to the opposite ends of the feedback resistor 3. The voltage clamp means 2 clamps a voltage applied to the ends of the feedback resistor 3, to prevent the amplifier unit 1 from saturating.

The transimpedance amplifier further has a current absorption means 5 arranged on the input side of the amplifier unit 1. The current absorption means 5 absorbs any large input current Ia supplied to the amplifier unit 1.

The transimpedance amplifier also has a switching selection means 4 to activate and deactivate the current absorption means 5 according to an external control signal Vs.

If the disk unit applies a large current to the amplifier unit 1 while writing data to a magneto-optic disk installed in the disk unit, the switching selection means 4 activates the current absorption means 5.

The voltage clamp means 2 may be a diode element connected to the output and input ends of the amplifier unit 1. The voltage clamp means 2 prevents an input voltage to an input transistor of the amplifier unit 1 from dropping to a level that deactivates the input transistor.

The current absorption means 5 connected to, for example, an inverting input terminal (−) of the amplifier unit 1, includes a current mirror circuit to entirely absorb a large input current Ia supplied to the amplifier unit 1 during a write operation to the disk. At this time, the voltage clamp means 2 prevents the current absorption means 5 from saturating and the base potential of the input transistor of the amplifier unit 1 from dropping. Namely, the voltage clamp means 2 prevents the current absorption means 5 as well as the amplifier unit 1 from saturating.

The switching selection means 4 may be a semiconductor switch disposed between the input end of the amplifier unit 1 and the current absorption means 5. The switching selection means 4 is turned ON only when a large current is produced during, for example, a write operation in the disk unit. Since the amplifier unit 1 is not saturated, the disk unit is able to quickly change from the write operation to a read operation.

In this way, the amplifier unit in the transimpedance amplifier of the present invention installed in, for example, a magneto-optic disk unit, will not saturate even if a large current is supplied to the amplifier unit, so that the disk unit is able to quickly change from a write mode to a read mode and process signals at high speed on high-density disks.

Transimpedance amplifiers based on the principle of the present invention of FIG. 2 will be explained with reference to FIGS. 3 to 11.

Figure 3:
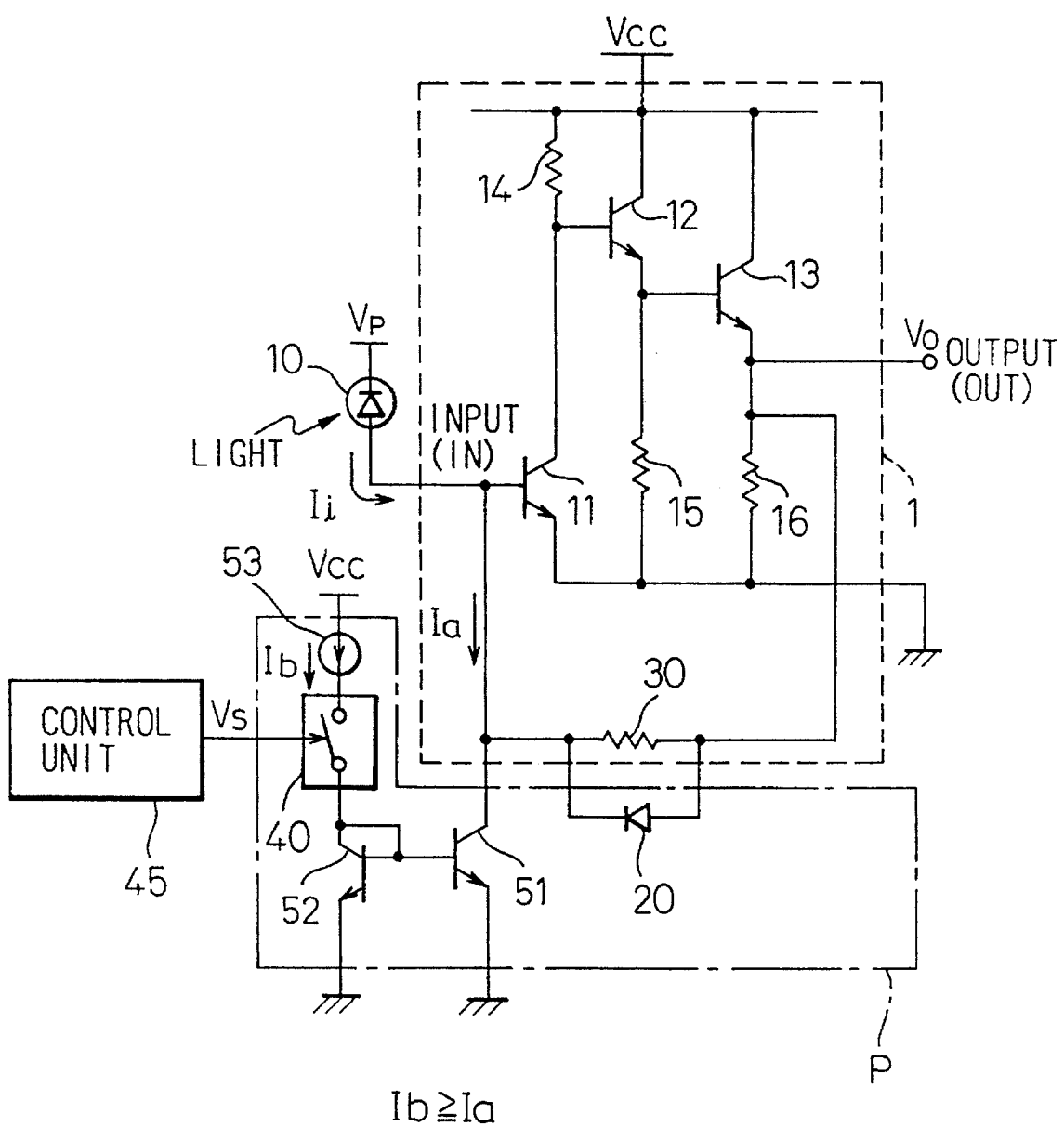
FIG. 3 is a circuit diagram showing a first embodiment of the present invention.

FIG. 3 is a circuit diagram showing a transimpedance amplifier according to the first embodiment of the present invention. This transimpedance amplifier is installed in, for example, the magneto-optic disk unit of FIG. 1. For the sake of simplicity of explanation, only one of the two photodiodes of the disk unit is shown in FIGS. 3 to 11. The same reference marks as those used in FIG. 2 represent like parts in the Figs. 3 to 11.

Referring to FIG. 3, the photodiode 10 produces an input current Ii in response to light that hits the photodiode 10. The photodiode 10 has junction capacitance of, for example, several picofarads.

An amplifier unit 1 has a transistor element connected to an input terminal IN, and two transistor elements forming a Darlington circuit connected to an output terminal OUT. These transistor elements are connected to resistors 14, 15, and 16 having suitable resistance values. The transistor elements may be an emitter-grounded bipolar transistor 11, and emitter-follower bipolar transistors 12 and 13 that form the Darlington circuit.

A feedback resistor 30 is connected between the output terminal OUT and input terminal IN of the amplifier unit 1. The resistance of the feedback resistor 30 is properly set to provide an output voltage Vo of required level in response to an input current Ii to the amplifier unit 1.

Part P is characteristic to the present invention. The part P includes a diode element connected to the opposite ends of the feedback resistor 30. The diode element clamps a voltage applied to the ends of the feedback resistor 30, to prevent the base potential of the bipolar transistor 11 of the amplifier unit 1 from dropping as well as preventing a bipolar transistor 51 of a current absorption means 5 from saturating. The diode element may be a pn-junction diode 20.

The part P also includes a first transistor element connected to the input terminal IN (inverting input terminal (−)) of the amplifier unit 1. The first transistor element may be the bipolar transistor 51 that absorbs a large current Ia supplied from the clamping diode 20 and photodiode 10. The part P further includes a second transistor element and a constant current source 53. The second transistor element cooperates with the first transistor element to form a current mirror circuit. The constant current source 53 supplies a predetermined constant current to the second transistor element. The second transistor element may be a bipolar transistor 52.

The part P of the present invention further includes a change-over switch 40 that may be an analog switch disposed between the constant current source 53 and the second transistor element. The change-over switch (hereinafter abbreviated to "switch") 40 is turned ON and OFF in response to a control signal Vs provided by an external control unit 45 that may be a microprocessor.

When the switch 40 is turned ON, a constant current is supplied to the second bipolar transistor 52, so that the first bipolar transistor 51 of the current mirror circuit may entirely absorb the large current Ia. When the switch 40 is turned OFF, the first and second transistors 51 and 52 are deactivated.

To surely absorb the large input current Ia, it is preferable that the current Ib supplied from the constant current source 53 to the second transistor 52 with the switch 40 being ON is greater than the current Ia to be absorbed by the first transistor 51.

The operation of the part P of the present invention will be explained with reference to FIGS. 4 to 7.

Figure 4:
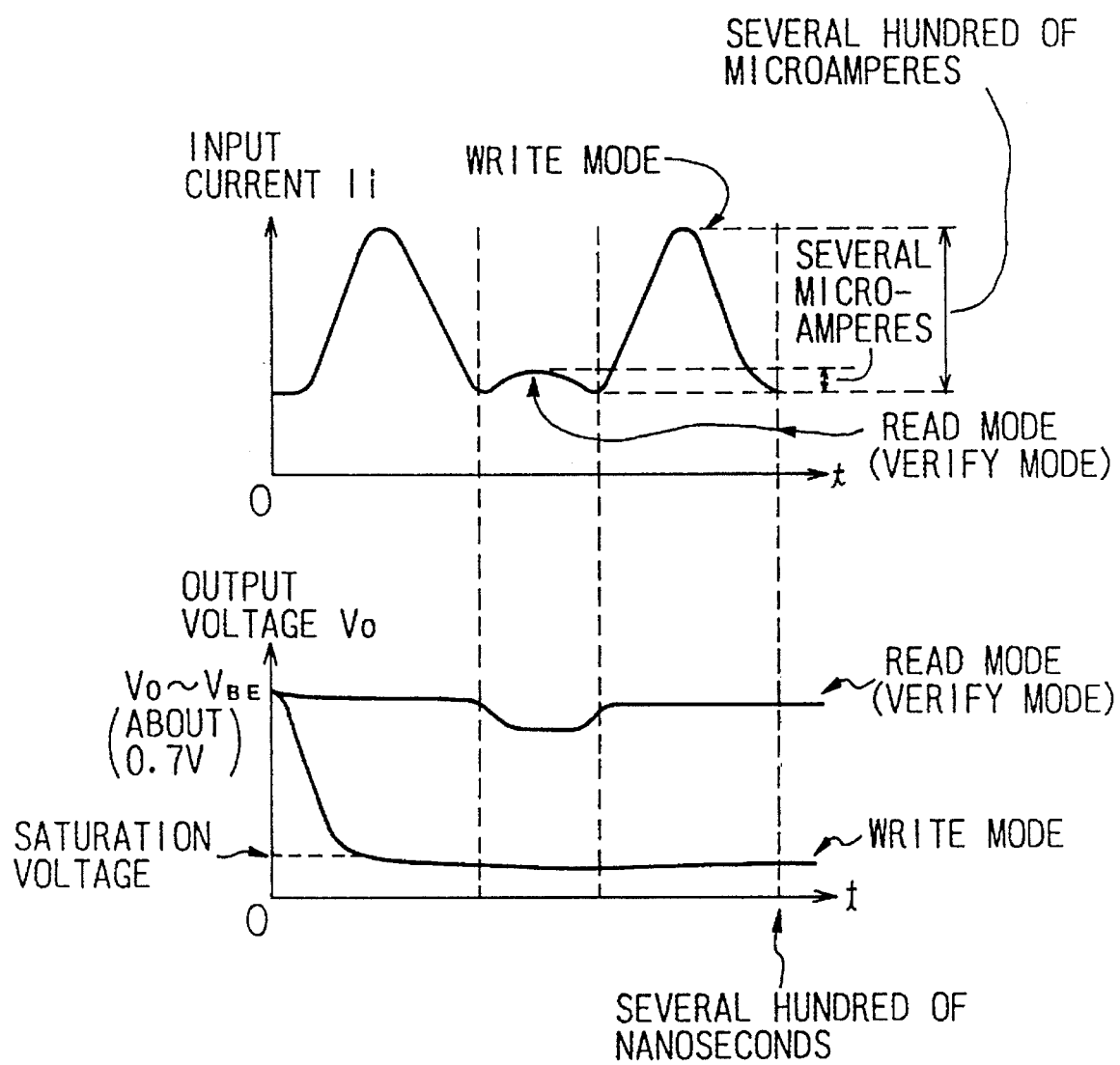
FIG. 4 explains write and read operations according to a prior art.
Figure 5:
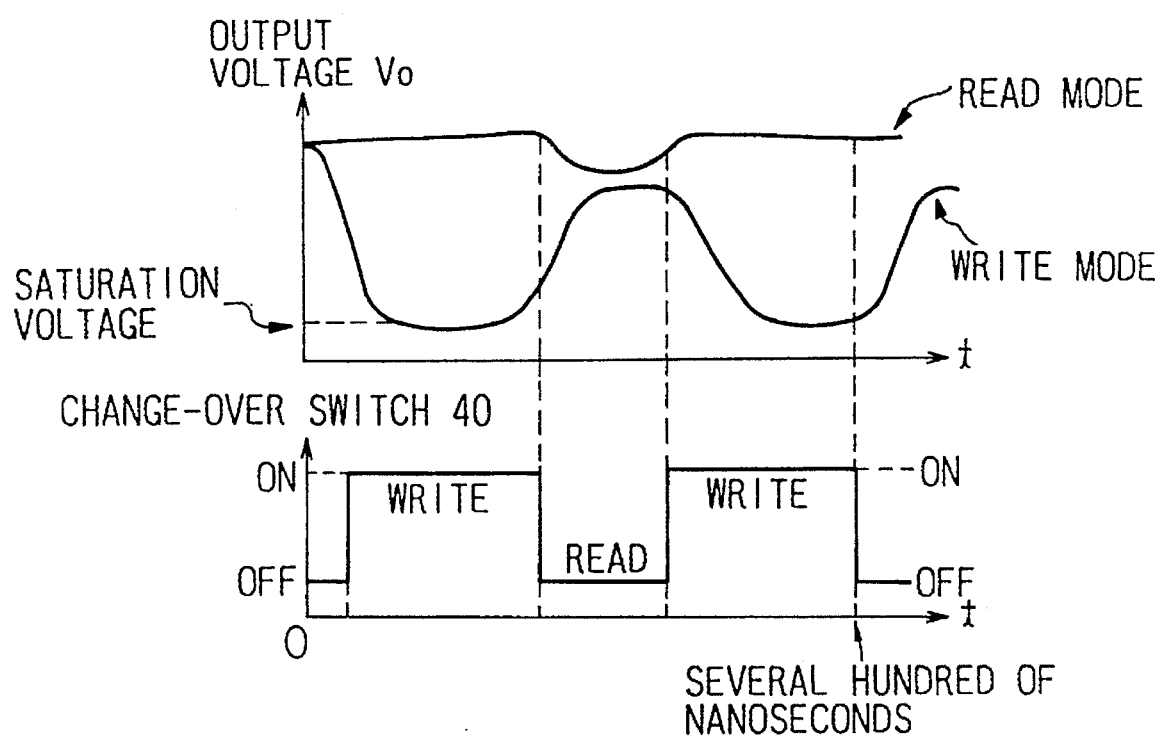
FIG. 5 explains write and read operations according to the present invention.
Figure 6:
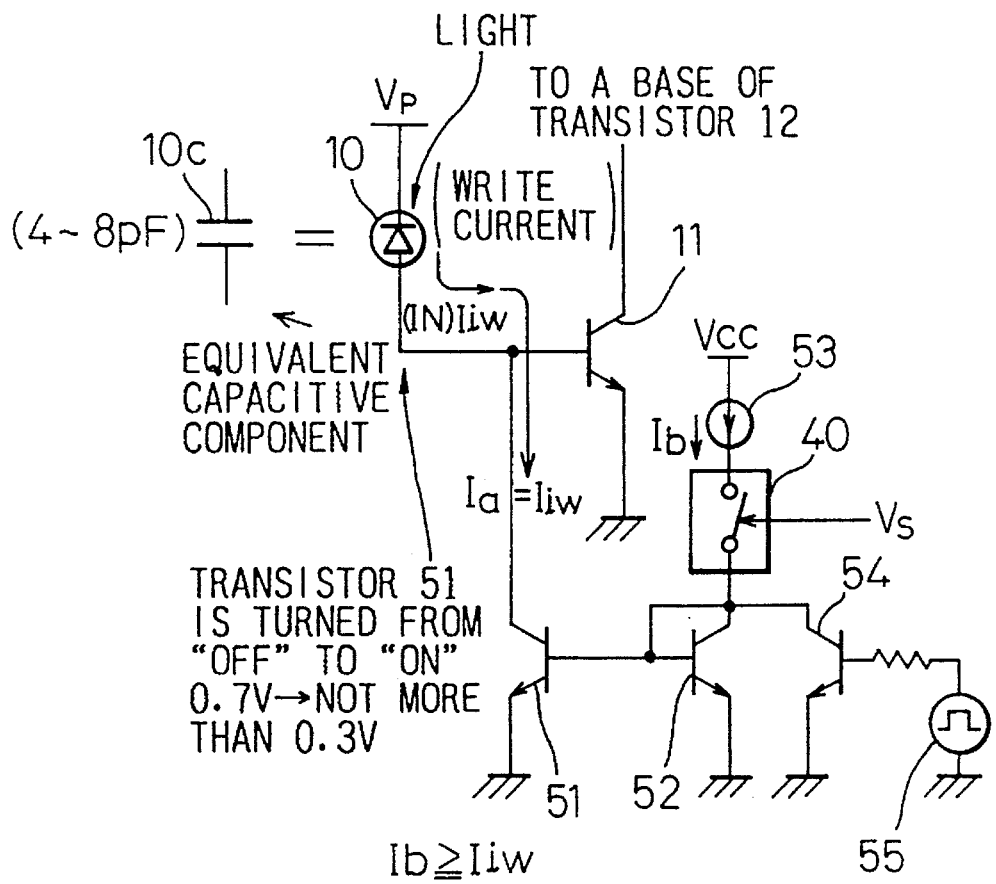
FIG. 6 shows the characteristic part of the present invention in the circuit of FIG. 3 under a write mode.
Figure 7:
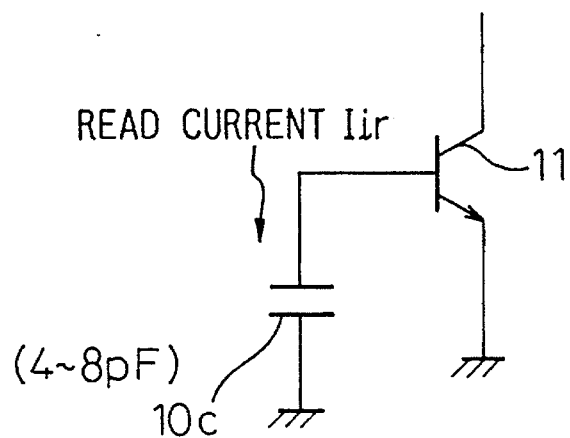
FIG. 7 explains a read operation with a photodiode of FIG. 6 being replaced with an equivalent capacitive component.

FIG. 4 explains write and read operations of the circuit of FIG. 3 without the part P, and FIG. 5 explains write and read operations of the circuit of FIG. 3 with the part P. FIG. 6 is a circuit diagram explaining the write operation of the part P of the present invention. FIG. 7 explains the read operation with the photodiode of FIG. 6 being replaced with an equivalent capacitive component.

Referring to FIG. 4, the photodiode 10 (FIG. 3) receives strong light to write or erase data to or from a magneto-optic disk and provides the input terminal of the amplifier unit 1 with a large current of, for example, several hundred of microamperes. If the bipolar transistor 11 of the amplifier unit 1 is saturated due to the large input current, the output voltage Vo of the amplifier unit 1 is dropped across the feedback resistor 30. Then, the amplifier unit 1 incorrectly operates to drop (reduce) the collector voltage of the bipolar transistor 13 on the output side and saturate the transistor 13. As shown in the lower part of FIG. 4, the output voltage Vo, which corresponds to a base-emitter voltage $V_{BE}$ of the active bipolar transistor 13, drops from about 0.7 V to a saturation voltage of 0.3 V or below. If the bipolar transistors 11 and 13 are deeply saturated, they will still be saturated even if the write operation is shifted to a read or verify operation. Namely, it takes several hundred of nanoseconds or longer to restore normal functions of the saturated transistors. If the transistors are saturated, it is impossible to complete the read operation within a specified read period.

The part P of FIG. 3 of the present invention solves these problems and quickly starts a read operation after a write operation as shown in FIG. 5. The first bipolar transistor 51 absorbs a large write current Iiw=Ia generated by the photodiode 10 in response to reflected light from the disk during the write operation. The second bipolar transistor 52 cooperates with the first transistor 51, to form the current mirror circuit. The constant current source 53 supplies the predetermined constant current Ib to the second transistor 52. To surely operate the current mirror circuit, the second transistor 52 is provided with a drive transistor 54 and a driver (i.e., a power source for driving the transistor 54) 55 as shown in FIG. 6. As explained above, the current Ib is set to be higher than the write current Iiw.

Referring to FIG. 6, when the switch 40 is turned ON during a write operation, the base potential of the bipolar transistor 11 of the amplifier unit 1, i.e., the voltage of the input terminal IN of the amplifier unit 1 drops from about 0.7 V to 0.3 V. When the write operation is changed to a read operation, the voltage of the input terminal IN of the amplifier unit 1 is 0.3 V or below. The amplifier unit 1 fulfills the read operation only when the base potential of the bipolar transistor 11 is increased to about 0.7 V.

During the read operation, light hits the photodiode 10, and the equivalent capacitive component 10c of, for example, 4 to 8 picofarads corresponding to the junction capacitance of the photodiode 10 receives a very weak read current Iir of 100 nanoamperes to several microamperes at the input terminal IN of the amplifier unit 1, as shown in FIGS. 6 and 7. As a result, the junction capacitor 10c is charged to increase the base potential of the bipolar transistor 11 to about 0.7 V.

Just after the completion of a write operation, the base current of the bipolar transistor 11 is too small to charge the equivalent capacitive element (i.e., junction capacitance) 10c, so that it takes a long time to start a read operation after the write operation.

Accordingly, the present invention adds the diode element, i.e., the pn-junction diode 20 to clamp the base potential of the bipolar transistor 11, and the switch 40 is turned ON during a write operation.

As a result, the first embodiment of the present invention quickly changes from a write mode to a read mode, without delay, as shown in FIG. 5. Namely, the bipolar transistors 11 and 13 will be ready for a read operation as soon as a write operation is completed.

In the lower part of FIG. 5, the switch 40 is turned ON only during a write operation, which is followed by a read or verify operation. A write current usually fluctuates, so that the current supplied by the constant current source 53 is set to be equal to or greater than a maximum current applied to the input terminal of the amplifier unit 1 during a write operation, to completely absorb the write current even if it reaches a maximum.

Figure 8:
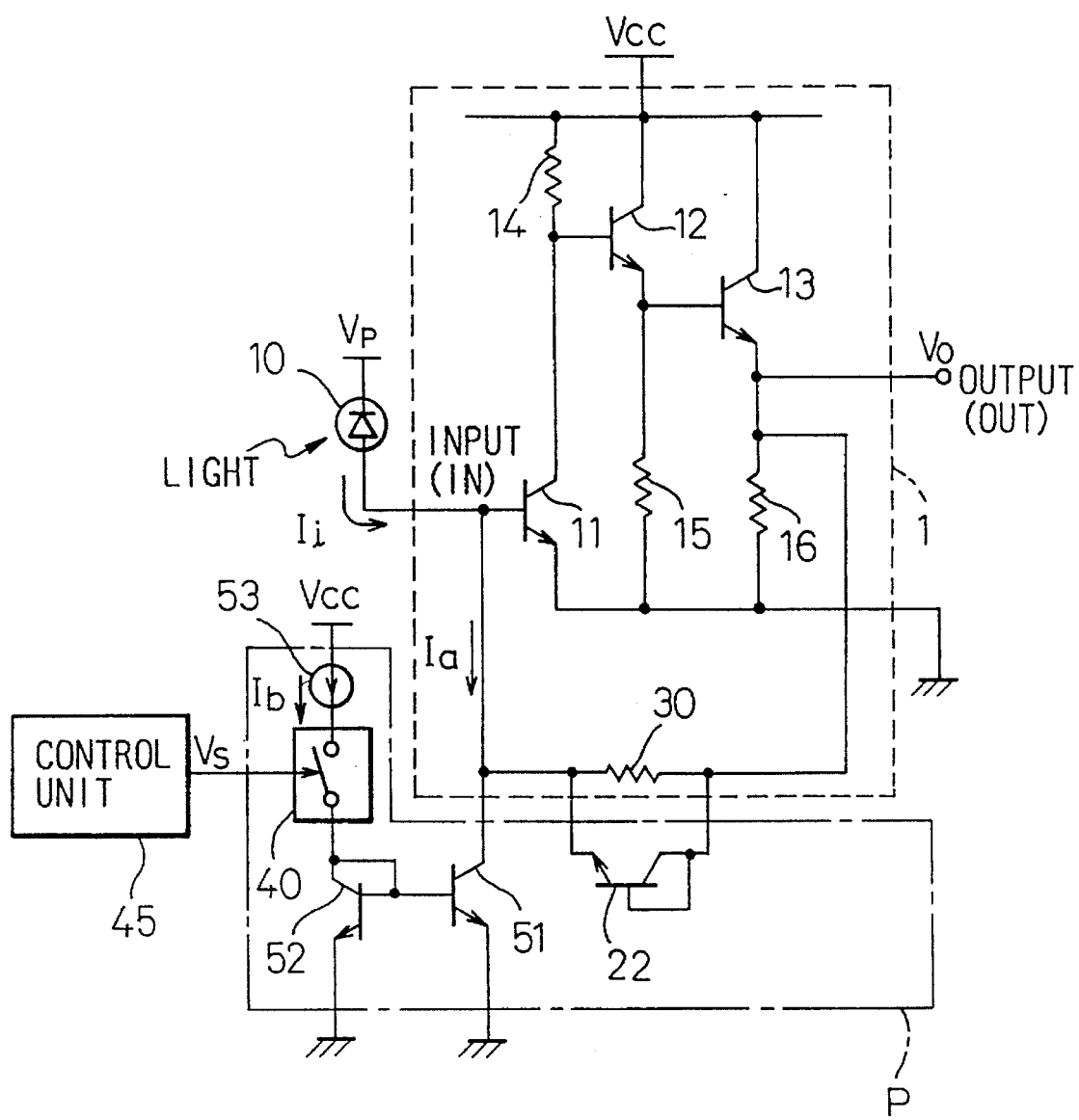
FIG. 8 is a circuit diagram showing a second embodiment of the present invention.

FIG. 8 is a circuit diagram showing a transimpedance amplifier according to the second embodiment of the present invention, installed in a magneto-optic disk unit.

The second embodiment of FIG. 8 differs from the first embodiment of FIG. 3 in that it employs a bipolar transistor 22 whose base and collector are short-circuited to each other, to clamp the base potential of the bipolar transistor 11 of the amplifier unit 1. The other parts of the second embodiment are the same as those of the first embodiment.

The second embodiment employs bipolar transistors, not only for the amplifier unit 1 and current mirror circuit, but also for the clamping diode, to simplify manufacturing process.

Figure 9:
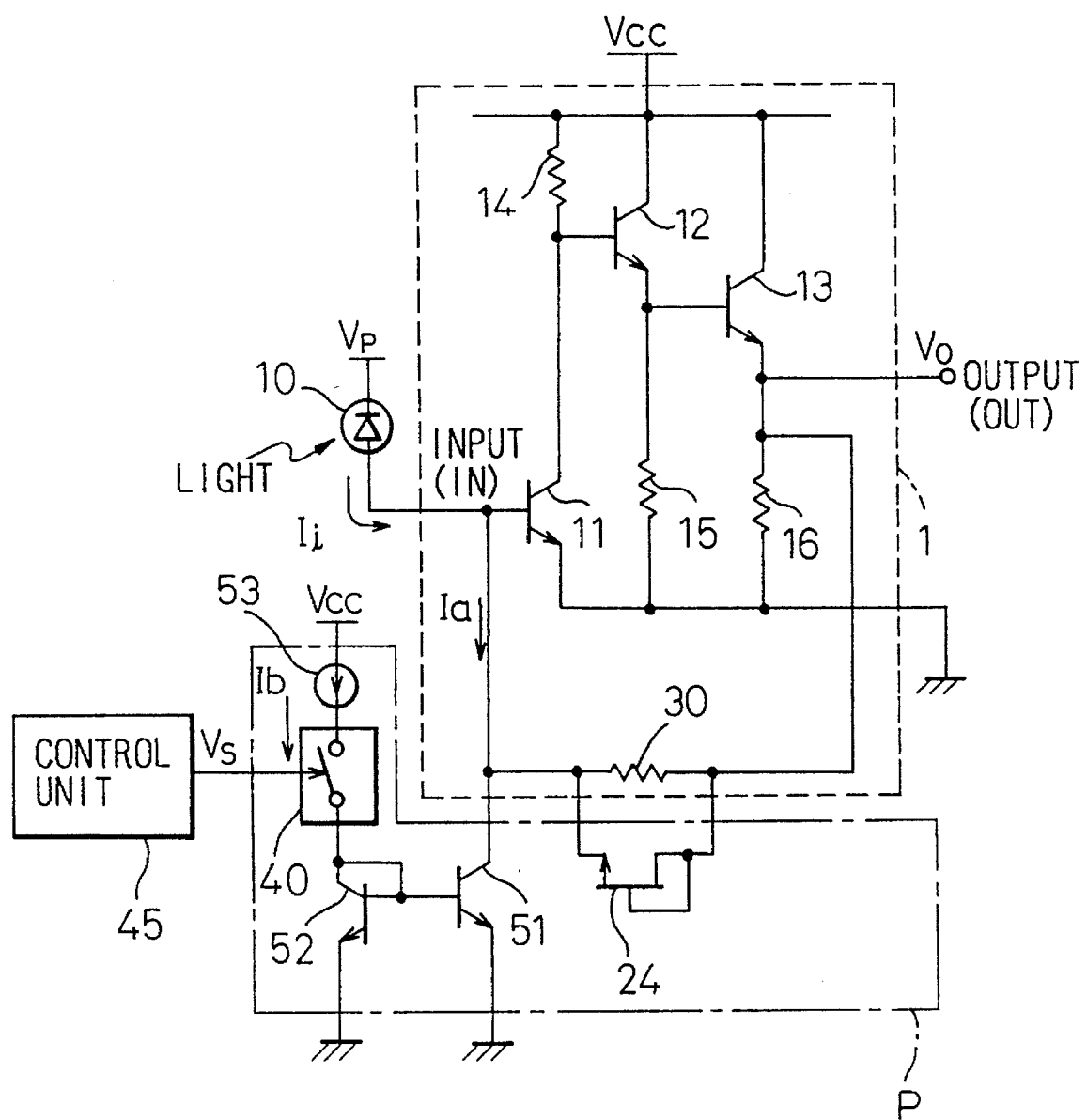
FIG. 9 is a circuit diagram showing a third embodiment of the present invention.

FIG. 9 is a circuit diagram showing a transimpedance amplifier according to the third embodiment of the present invention, installed in a magneto-optic disk unit.

The third embodiment differs from the first and second embodiments in that it employs a field effect transistor 24 which may be a MOS field effect transistor (hereinafter referred to as the MOS transistor), or a junction-type field effect transistor. The gate and drain of the transistor 24 are short-circuited to each other, to clamp the base potential of the bipolar transistor 11 of the amplifier unit 1. The other parts of the third embodiment are the same as those of the first embodiment.

The MOS transistor is advantageous because its threshold voltage Vth is adjustable through a back gate (i.e., a gate of the MOS transistor which is connected to the amplifier 1 in the backward direction). In addition, the MOS transistor usually involves less voltage fluctuation than a bipolar transistor, to make the designing of the transimpedance amplifier easier.

Figure 10:
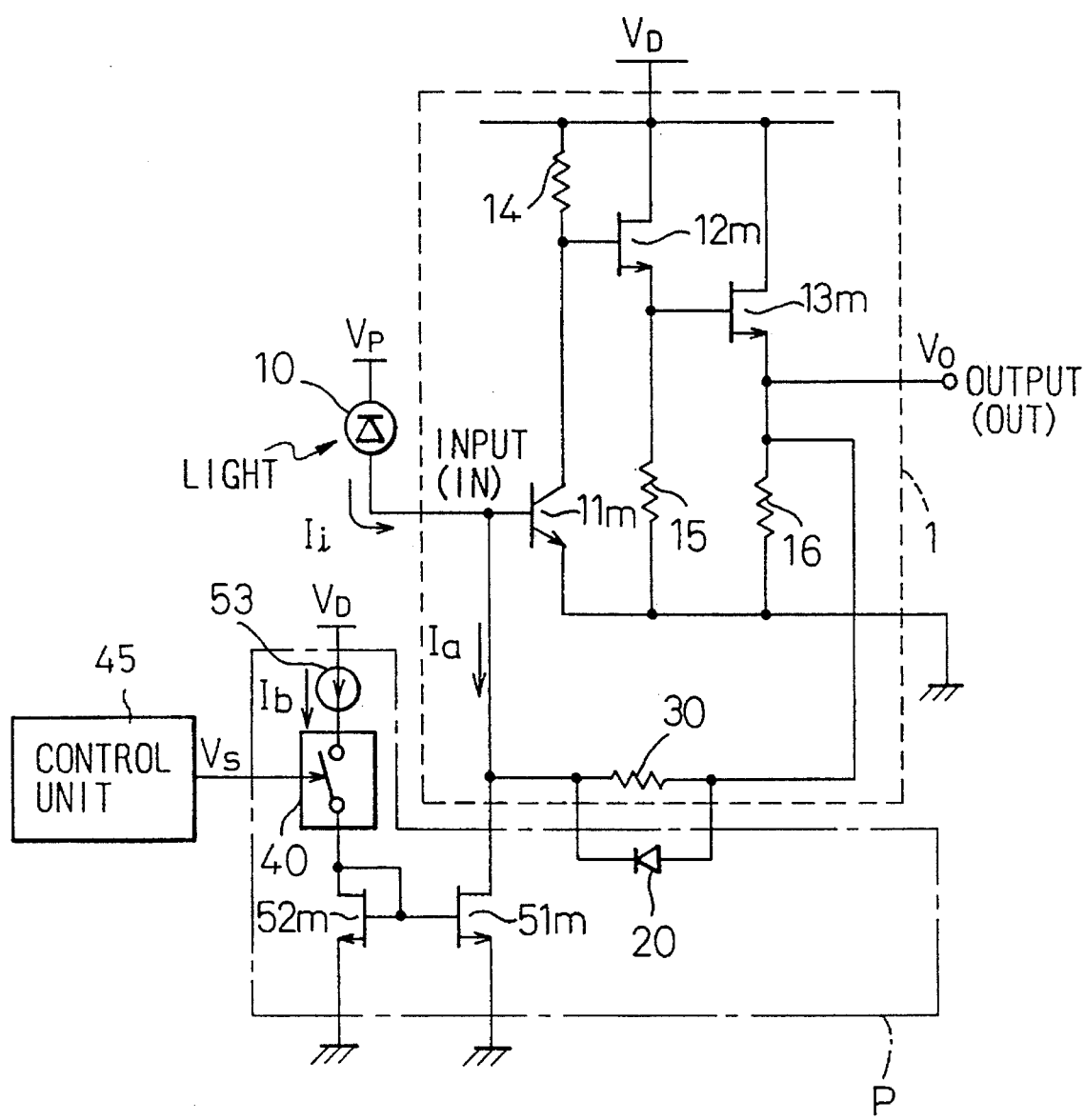
FIG. 10 is a circuit diagram showing a fourth embodiment of the present invention.

FIG. 10 is a circuit diagram showing a transimpedance amplifier according to the fourth embodiment of the present invention, installed in a magneto-optic disk unit.

The fourth embodiment differs from the first embodiment in that it employs an amplifier unit 1 consisting of a bipolar transistor 11m and two MOS transistors 12m and 13m, and a current mirror circuit consisting of MOS transistors 51m and 52m. The other parts of the fourth embodiment are the same as those of the first embodiment.

The fourth embodiment consumes less electrical power because of the MOS transistors.

Figure 11:
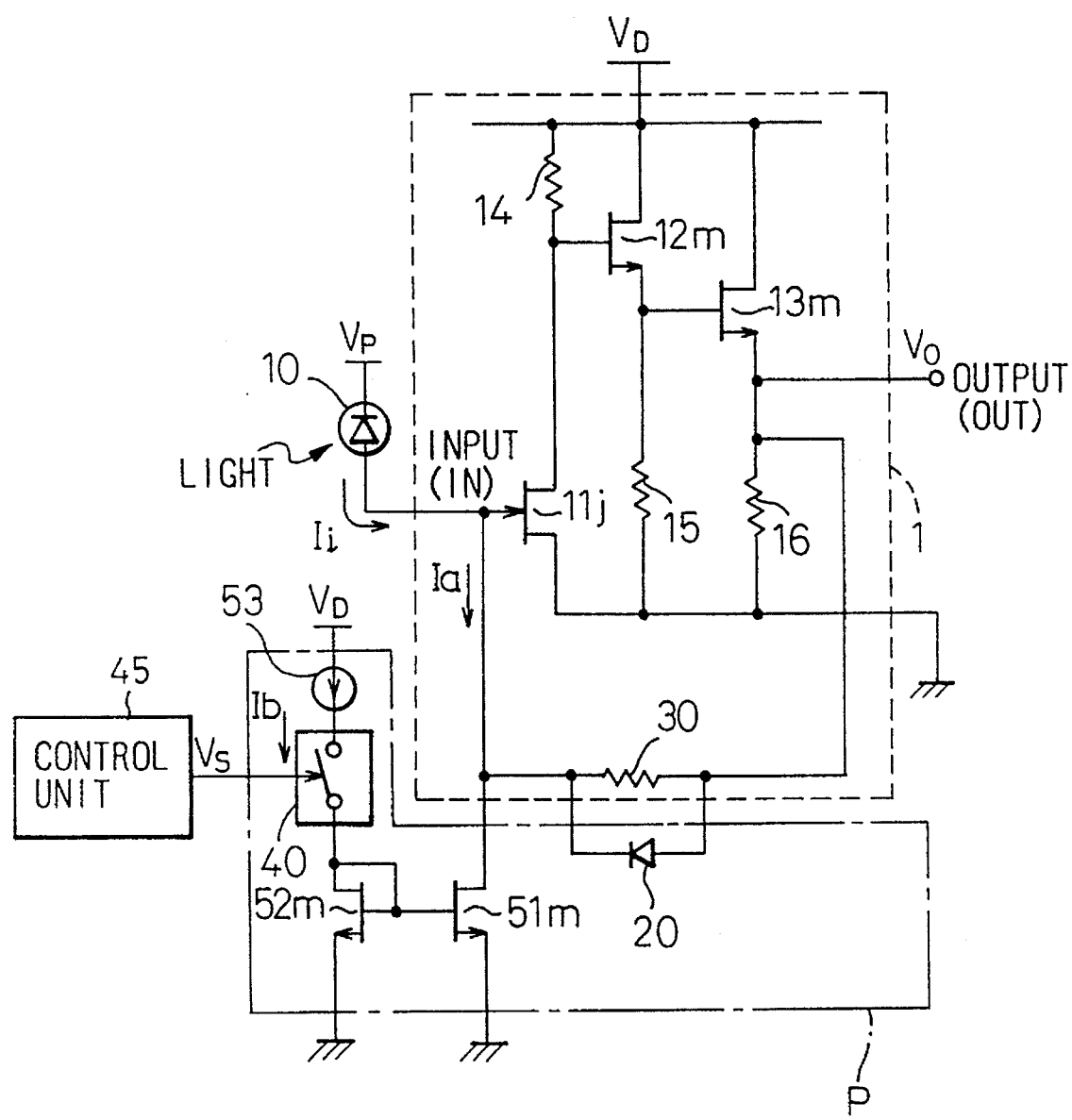
FIG. 11 is a circuit diagram showing a fifth embodiment of the present invention.

FIG. 11 is a circuit diagram showing a transimpedance amplifier according to the fifth embodiment of the present invention, installed in a magneto-optic disk unit.

The fifth embodiment differs from the fourth embodiment in that it employs an amplifier unit 1 whose input transistor is a junction-type field effect transistor 11j. The other parts of the fifth embodiment are the same as those of the fourth embodiment.

The junction-type field-effect transistor produces less noise. Since noise causes a serious problem particularly at the input of the amplifier unit 1, the fifth embodiment employs the junction-type field-effect transistor at the input of the amplifier unit 1. This embodiment can process signals at high speed.

The various circuit elements employed for particular parts of the transimpedance amplifiers of the above embodiments may be properly combined, to form other transimpedance amplifiers.

The transimpedance amplifiers of the above embodiments employ npn bipolar transistors, n-channel MOS transistors, and junction-type n-channel field effect transistors. It is possible to employ pnp transistors, p-channel transistors, and Schottky transistors, to form transimpedance amplifiers.

As explained above, a transimpedance amplifier according to the present invention is installed in, for example, a magneto-optic disk unit. The transimpedance amplifier employs an amplifier unit, and diode and transistor elements for preventing the amplifier unit from saturating even if a large current is applied to the amplifier unit, so that the disk unit may quickly start a read operation after a write operation and process write and read signals at high speed on high-density magneto-optic disks. According to the present invention, a single diode element is sufficient to prevent the amplifier unit from saturating, and therefore, the structure of the transimpedance amplifier according to the present invention is simple.

While the present invention has been described as related to the preferred embodiments, it will be understood that various changes and modifications may be made without departing from the spirit and the scope of the invention as hereinafter claimed.

What is claimed:

1. A transimpedance amplifier having an amplifier unit and a feedback resistor arranged between the output and input ends of the amplifier unit, for amplifying and converting an input current into an output voltage of predetermined level said amplifier unit having a transistor element connected to an input terminal of said amplifier unit, wherein the transimpedance amplifier includes:

voltage clamp means, connected to the opposite ends of the feedback resistor, for clamping a voltage applied to the ends of the feedback resistor, for preventing an input voltage to said transistor element from dropping to a level that deactivates said input transistor, and for preventing the amplifier unit from saturating;

current absorption means, arranged on the input side of the amplifier unit, for absorbing any large input current supplied to the amplifier unit; and switching selection means for activating or deactivating the current absorption means according to an external control signal.

2. The transimpedance amplifier as claimed in claim 1, wherein the current absorption means is activated through the switching selection means when a large input current is produced to write data to a magneto-optic disk.

3. A transimpedance amplifier having an amplifier unit and a feedback resistor arranged between the output and input ends of the amplifier unit, for amplifying and converting an input current into an output voltage of predetermined level, comprising:

a diode element connected to the opposite ends of the feedback resistor, to clamp a voltage applied to the ends of the feedback resistor and prevent the amplifier unit from saturating;

a first transistor element connected to the input end of the amplifier unit, to absorb any large input current supplied to the amplifier unit;

a second transistor element cooperating with the first transistor element, to form a current mirror circuit;

a constant current source for supplying a predetermined constant current to the second transistor element; and a change-over switch arranged between the constant current source and the second transistor element and turned ON and OFF in response to an external control signal, the change-over switch being turned ON to supply the constant current to the second transistor element so that the first transistor element of the current mirror circuit may entirely absorb any large input current, the change-over switch being turned OFF to deactivate the first and second transistor elements.

4. The transimpedance amplifier as claimed in claim 3, wherein the change-over switch is turned ON when data are written to a magneto-optic disk and is turned OFF when data are read out of the magneto-optic disk.

5. The transimpedance amplifier as claimed in claim 3, wherein the current supplied by the constant current source to the second transistor element with the change-over switch being ON is equal to or greater than a large input current to be absorbed by the first transistor element.

6. The transimpedance amplifier as claimed in claim 3, wherein the diode element is a pn-junction diode.

7. The transimpedance amplifier as claimed in claim 3, wherein the diode element is a bipolar transistor whose base and collector are short-circuited to each other.

8. The transimpedance amplifier as claimed in claim 3, wherein the diode element is a MOS transistor whose gate and drain are short-circuited to each other.

9. The transimpedance amplifier as claimed in claim 3, wherein the first and second transistor elements are each a bipolar transistor.

10. The transimpedance amplifier as claimed in claim 3, wherein the first and second transistor elements are each a MOS transistor.

11. The transimpedance amplifier as claimed in claim 3, wherein the diode element is a pn-junction diode, and the first and second transistor elements are each a bipolar transistor.

12. The transimpedance amplifier as claimed in claim 3, wherein the diode element is a bipolar transistor whose base and collector are short-circuited to each other, and the first and second transistor elements are each a bipolar transistor.

13. The transimpedance amplifier as claimed in claim 3, wherein the diode element is a MOS transistor whose gate and drain are short-circuited to each other, and the first and second transistor elements are each a bipolar transistor.

14. The transimpedance amplifier as claimed in claim 3, wherein the diode element is a pn-junction diode, and the first and second transistor elements are each a MOS transistor.

* * * * *